(12) United States Patent
Lim

(10) Patent No.: US 11,183,525 B2
(45) Date of Patent: Nov. 23, 2021

(54) IMAGE SENSOR INCLUDING LASER SHIELD PATTERN

(71) Applicant: Samsung Electronics Co., Ltd., Suwon-si (KR)

(72) Inventor: Ha Jin Lim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/401,752

(22) Filed: May 2, 2019

(65) Prior Publication Data

US 2020/0119072 A1 Apr. 16, 2020

(30) Foreign Application Priority Data

Oct. 10, 2018 (KR) .................. 10-2018-0120756

(51) Int. Cl.
*H01L 31/0232* (2014.01)
*H01L 27/146* (2006.01)
*G02B 1/14* (2015.01)
*G02B 1/115* (2015.01)

(52) U.S. Cl.
CPC ........ *H01L 27/14623* (2013.01); *G02B 1/115* (2013.01); *G02B 1/14* (2015.01); *H01L 27/1462* (2013.01); *H01L 27/1463* (2013.01); *H01L 27/1464* (2013.01); *H01L 27/14605* (2013.01); *H01L 27/14621* (2013.01); *H01L 27/14627* (2013.01); *H01L 27/14636* (2013.01); *H01L 27/14645* (2013.01)

(58) Field of Classification Search
None
See application file for complete search history.

(56) References Cited

U.S. PATENT DOCUMENTS

| | | |
|---|---|---|
| 8,119,439 B2 | 2/2012 | Park |
| 8,537,255 B2 | 9/2013 | Lee |
| 9,368,531 B2 | 6/2016 | Cheng |
| 9,570,493 B2 | 2/2017 | Cheng |
| 2011/0096255 A1* | 4/2011 | Rho .................. C09K 19/0275 349/33 |
| 2012/0313208 A1 | 12/2012 | Kim |
| 2013/0153901 A1* | 6/2013 | JangJian ........... H01L 27/14623 257/49 |
| 2015/0048467 A1 | 2/2015 | Weng |
| 2015/0187826 A1* | 7/2015 | Suzuki ............. H01L 27/14625 348/281 |
| 2016/0276386 A1 | 9/2016 | Hsu |
| 2017/0221951 A1 | 8/2017 | Zheng |
| 2018/0158850 A1 | 6/2018 | Wu |

\* cited by examiner

*Primary Examiner* — Hung K Vu
(74) *Attorney, Agent, or Firm* — Myers Bigel, P.A.

(57) ABSTRACT

An image sensor includes a substrate including a plurality of unit pixels, a stack structure on the substrate, and a grid pattern between ones of the plurality of unit pixels on the stack structure. The grid pattern includes a lower grid pattern and an upper grid pattern on the lower grid pattern, the lower grid pattern including lanthanum oxide (LaO), amorphous silicon (a-Si), or polysilicon (poly-Si) and the upper grid pattern including a conductive material.

20 Claims, 16 Drawing Sheets

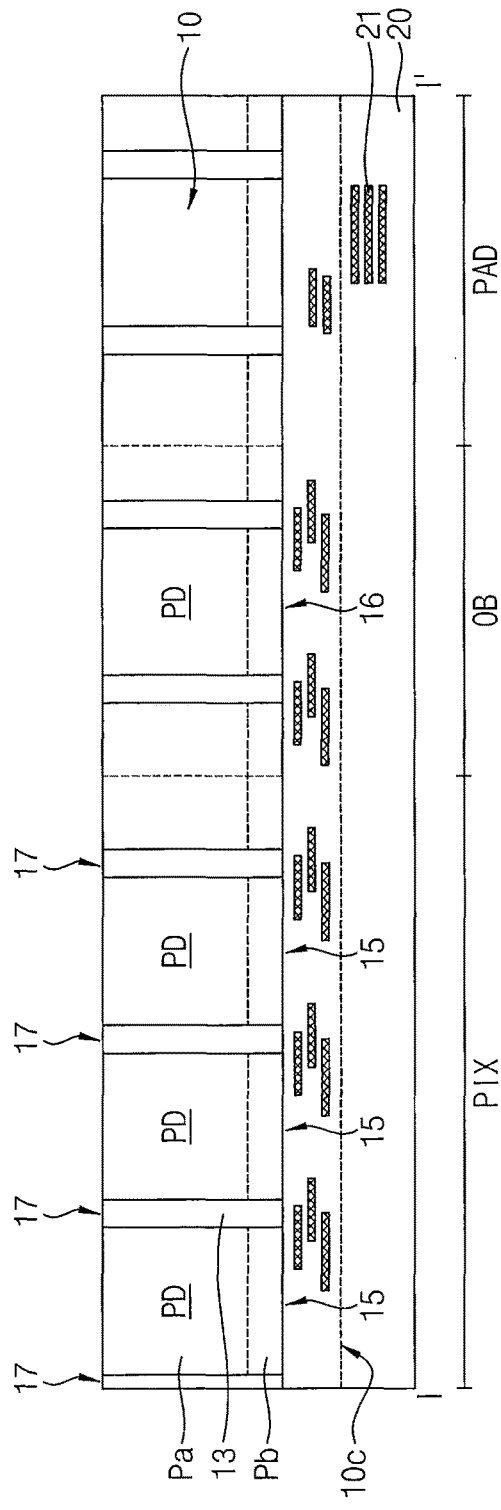
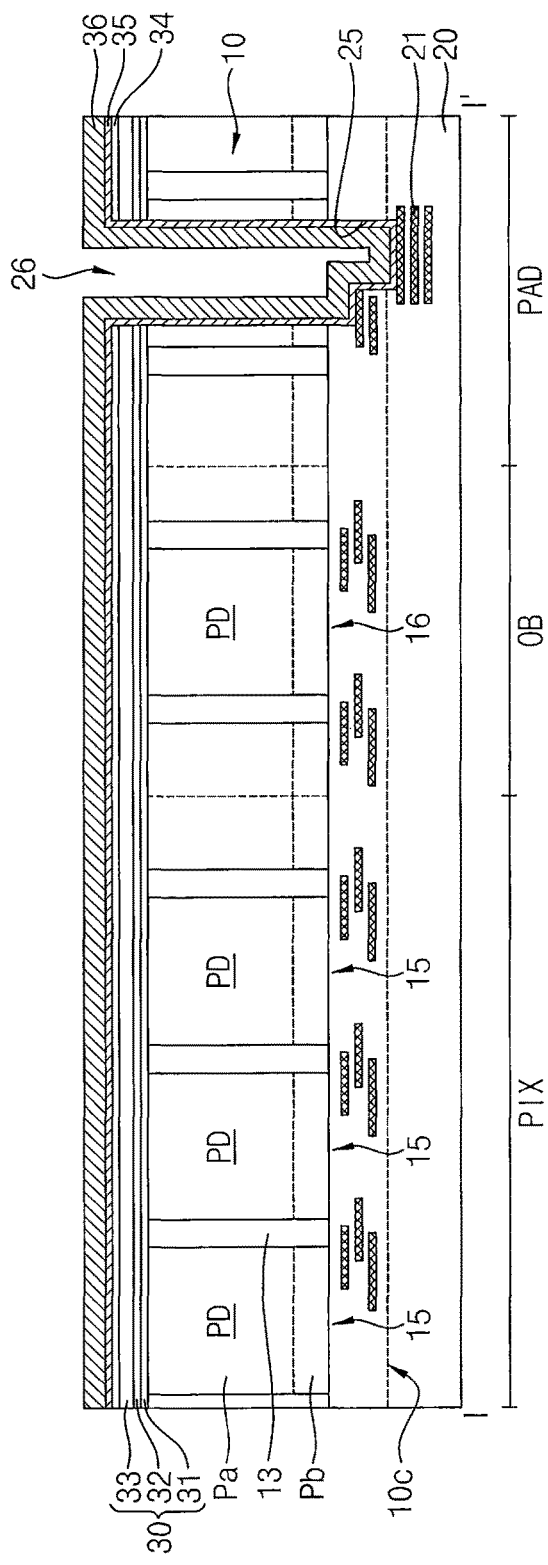
FIG. 20
FIG. 21

IMAGE SENSOR INCLUDING LASER SHIELD PATTERN

CROSS-REFERENCE TO RELATED APPLICATION

This U.S. non-provisional patent application claims priority under 35 U.S.C. § 119 to and the benefit of Korean Patent Application No. 10-2018-0120756, filed on Oct. 10, 2018, in the Korean Intellectual Property Office (KIPO), the disclosure of which is incorporated herein by reference in its entirety.

BACKGROUND

1. Field

Apparatuses and methods consistent with exemplary embodiments relate to an image sensor including a laser shield pattern and a method of manufacturing the same.

2. Discussion of Related Art

An image sensor is a device configured to acquire an image by using a property of a semiconductor that reacts to incident light. The image sensor may include a photoelectric conversion unit configured to convert incident light into an electrical signal and a logic circuit unit configured to process the electrical signal to generate data. The image sensor can improve optical sensitivity thereof by using a microlens array that changes the path of light incident on an outer region of the photoelectric conversion unit, such that light is condensed on the photoelectric conversion unit.

As semiconductor devices become highly integrated, image sensors may also be highly integrated. As a result, the size of individual pixels may be reduced.

SUMMARY

The example embodiments of inventive concept are directed to providing an image sensor having improved sensitivity.

In addition, the example embodiments of inventive concept are directed to a method of manufacturing an image sensor having improved sensitivity.

According to the some example embodiments, there is provided an image sensor including a substrate including a plurality of unit pixels, a stack structure on the substrate, and a grid pattern between ones of the plurality of unit pixels on the stack structure. The grid pattern includes a lower grid pattern and an upper grid pattern on the lower grid pattern, the lower grid pattern including lanthanum oxide (LaO), amorphous silicon (a-Si), or polysilicon (poly-Si) and the upper grid pattern including a conductive material.

According to the some example embodiments, there is provided an image sensor including a substrate including a photodiode in a pixel region and an optical black region adjacent the pixel region, and an optical black pattern in the optical black region. Concave recesses are in lower ends of sidewalls of the optical black pattern, respectively.

BRIEF DESCRIPTION OF THE DRAWINGS

FIGS. 18 to 24 are process cross-sectional views illustrating a method of manufacturing an image sensor having a cross section taken along line II-Ir according to some example embodiments of FIG. 1.

DETAILED DESCRIPTION OF EMBODIMENTS

Figure 1:
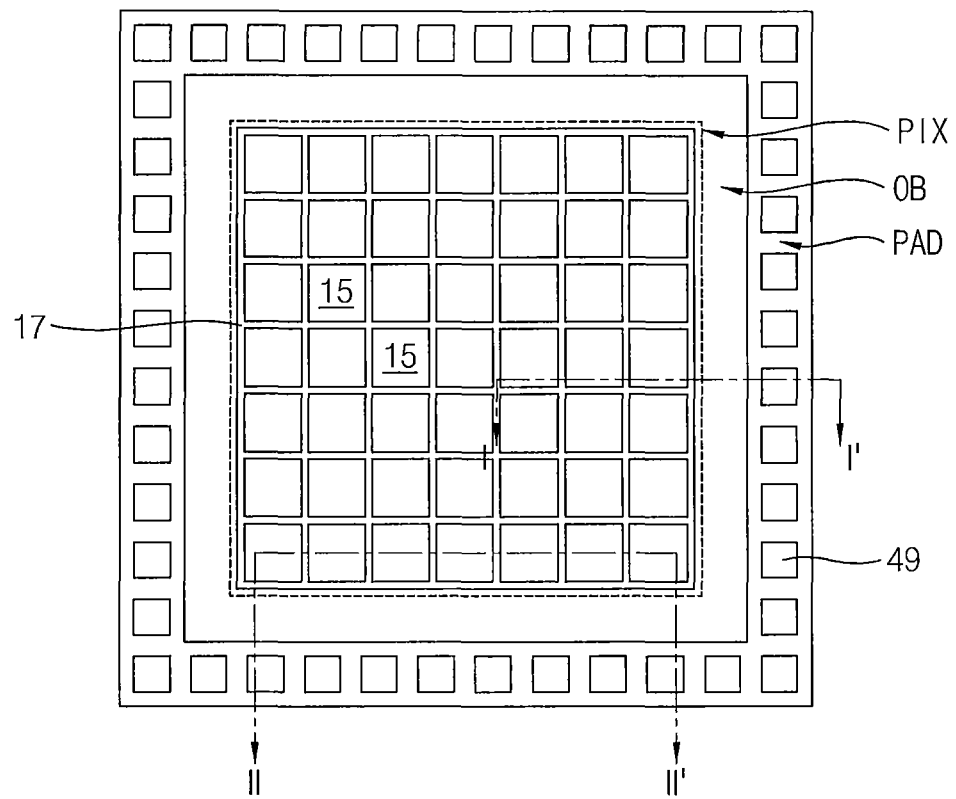
FIG. 1 is a plan view schematically showing an image sensor according to some example embodiments of the inventive concept.

The inventive concept will now be described more fully with reference to the accompanying drawings, in which example embodiments of the inventive concept are shown. Like reference numerals may refer to like elements throughout this application. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 2:
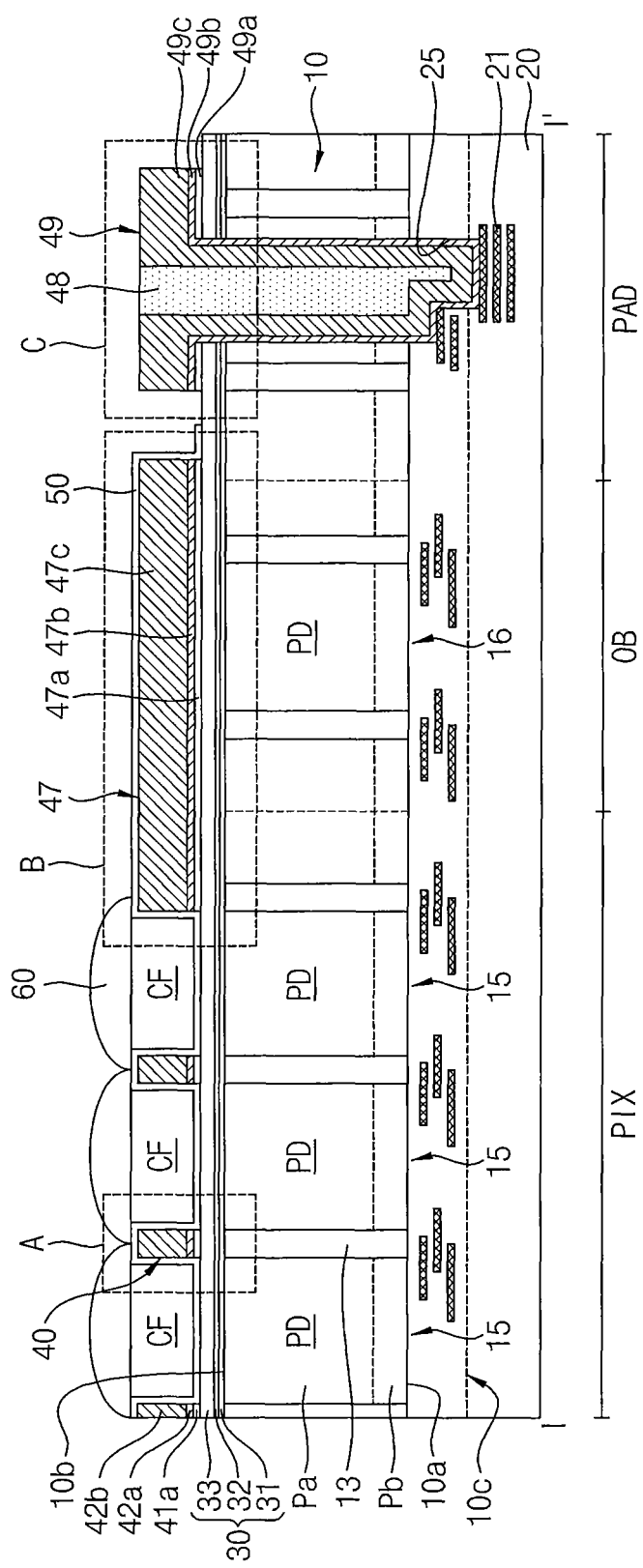
FIG. 2 is a vertical cross-sectional view taken along line I-I' according to some example embodiment of FIG. 1.

FIG. 1 is a plan view schematically showing an image sensor according to some example embodiments of the inventive concept. FIG. 2 is a vertical cross-sectional view taken along line I-I' according to some example embodiments of FIG. 1.

Referring to FIGS. 1 and 2, an image sensor 100 may include a substrate 10, interconnection structures 20 and 21, a first insulating layer 31, an anti-reflective layer 32, a second insulating layer 33, a color filter CF, a grid pattern 40, an optical black pattern 47, a via plug 48 and 49, a protective layer 50, and a microlens 60.

The substrate 10 may include a semiconductor substrate. For example, the substrate 10 may include single crystalline silicon and, in some embodiments, a silicon epitaxial layer. The substrate 10 may include a first surface 10a and a second surface 10b. For example, the first surface 10a may be a front surface and the second surface 10b may be a rear surface. The image sensor 100 may be a backside illuminated image sensor (BIS) configured to generate image data in response to light incident through the rear surface 10b of the substrate 10.

The substrate 10 may include a pixel region PIX, an optical black region OB, and a pad region PAD. The optical black region OB may be disposed between the pixel region PIX and the pad region PAD. For example, the optical black region OB may be disposed so as to at least partially surround the edges of the pixel region PIX. The pixel region PIX may include a plurality of unit pixels 15 and 16 arranged in a matrix form and a light blocking region 17 defining the unit pixels 15 and 16.

A photodiode PD and an element isolation layer 13 may be disposed in the substrate 10. The photodiode PD may be disposed so as to correspond to the unit pixel 15. The photodiode PD may include a P-type doped region and an N-type doped region. The element isolation layer 13 may be disposed between the unit pixels 15 in the pixel region PIX. The element isolation layer 13 may pass through the substrate 10 so as to extend from the first surface 10a to the second surface 10b as shown in FIG. 2. The element isolation layer 13 configured as above may be formed by a frontside deep trench isolation (FDTI) process.

The interconnection structures 20 and 21 may be disposed on the first surface 10a of the substrate 10. The interconnection structures 20 and 21 may include an interlayer insulating layer 20 and interconnections 21. The interlayer insulating layer 20 may be a monolithic layer or, in other embodiments, formed by bonding a plurality of layers. For example, the interlayer insulating layer 20 of FIG. 2 may be formed by bonding at least two layers, which may be bonded along a bonding surface 10c. A plurality of wires 21 may be disposed in the interlayer insulating layer 20. Although not shown in the drawings, a support substrate may be attached to the interconnection structures 20 and 21.

A stack structure 30, which is formed by sequentially stacking the first insulating layer 31, the anti-reflective layer 32, and the second insulating layer 33, may be disposed on the second surface 10b of the substrate 10. The stack structure 30 may be a light-transmitting layer through which incident light passes.

The first insulating layer 31 may be made of a material having a negative fix charge. In some embodiments, the first insulating layer 31 may be formed of a metal oxide film or a fluorine-doped metal oxide film. The first insulating layer 31 may be formed of a metal oxide or fluorine-doped metal oxide containing one or more metal materials, such as, but not limited to, aluminum (Al), hafnium (Hf), zirconium (Zr), tantalum (Ta), titanium (Ti), yttrium (Y), and/or lanthanoid (La). For example, the first insulating layer 31 may be aluminum oxide (AlO). The first insulating layer 31 may cause holes to accumulate around the second surface 10b of the substrate 10, thereby effectively reducing a dark current and white spots.

The refractive index of the anti-reflective layer 32 may be controlled to suppress reflection of the incident light and secure a high transmittance. The anti-reflective layer 32 may reduce or prevent reflection of the incident light, such that the incident light can smoothly reach the photodiode PD of the unit pixel 15 through the color filter CF. For example, the refractive index of the anti-reflective layer 32 may be greater than or equal to about 2.0 and less than or equal to about 2.5, but embodiments of the inventive concept are not limited thereto. The material and thickness of the anti-reflective layer 32 may be varied based on the wavelength of incident light. For example, the anti-reflective layer 32 may be a single, monolithic layer or a multilayer. The anti-reflective layer 32 may be referred to as a bottom anti-reflective layer (BARL) in the sense that the anti-reflective layer 32 is formed under the microlens 60 and the color filter CF on which light is incident.

The second insulating layer 33 may be an insulating layer that physically and chemically protects the image sensor 100. In the image sensor 100 having backside deep trench isolation (BDTI), the second insulating layer 33 may at least partially fill a gap of the BDTI. The second insulating layer 33 absorbs infrared rays in the incident light to improve the sensitivity of the image sensor 100. For example, the second insulating layer 33 may include one or more materials, such as, but not limited to, silicon oxide ($SiO_2$) and/or silicon oxycarbide (SiOC).

In the pixel region PIX, the color filter CF, the grid pattern 40, and the microlens 60 may be disposed on the stack structure 30. The color filter CF may include a red, green, or blue color filter CF based on the unit pixel 15. The color filter CF may be two-dimensionally arranged and may include a yellow filter, a magenta filter, and/or a cyan filter. The color filter CF may further include a white filter. When the image sensor 100 includes an infrared photodiode, the image sensor 100 may include an infrared (IR) filter corresponding to the infrared photodiode PD.

The grid pattern 40 may be disposed between the color filters CF on the second insulating layer 33. The grid pattern 40 may be disposed in the light blocking region 17 between the unit pixels 15. For example, the grid pattern 40 may overlap the element isolation layer 13 in a plan view thereof. For example, the grid pattern 40 may have a grid shape having rows and columns. The grid pattern 40 may reflect incident light obliquely incident on the substrate 10, thereby causing more incident light to reach the photodiode PD and reducing or preventing crosstalk. The protective layer 50 may at least partially cover the second insulating layer 33 and the grid pattern 40. The protective layer 50 may be disposed between the second insulating layer 33 and the color filter CF and between the grid pattern 40 and the color filter CF. The level of the upper surface of the portion of the protective layer 50 covering the upper surface of the grid pattern 40 may generally correspond to or be lower than the level of the upper surface of the color filter CF. That is, the grid pattern 40 and the protective layer 50 may be generally coplanar with the color filter CF. The protective layer 50 may serve to reduce or prevent moisture absorption. The protective layer 50 may protect the metal layers 35 and 36 or the insulating layers around the color filter CF from moisture and dust to reduce or prevent dispersion degradation of the color filter CF. In some embodiments, the protective layer 50 may include aluminum oxide (AlO).

The microlenses 60 corresponding to the respective color filters CF may be disposed on the color filters CF. The microlenses 60 may be formed so as to overlap corresponding color filters CF. The microlens 60 has a convex shape and may have a predetermined radius of curvature. The microlens 60 may change the path of light incident on a region out of the photodiode PD to condense the light into the photodiode PD.

The optical black pattern 47 and the reference pixel 16 may be disposed in the optical black region OB. Control circuits (not shown) may be included in the optical black region OB. The reference pixel 16 may include a reference photodiode disposed inside the substrate 10 and a reference transistor (not shown) configured to transport charges generated therefrom.

The optical black pattern 47 may be disposed on the stack structure 30 to, in some embodiments, cover the entire optical black region OB. The optical black pattern 47 may be disposed to cover the reference pixel 16 and the reference transistor (not shown). One end of the optical black pattern 47 may extend and, thus, a part of the optical black pattern 47 may extend to the pixel region PIX. The other end of the optical black pattern 47 may extend and, thus, a part of the optical black pattern 47 may extend to the pad region PAD. The optical black pattern 47 may be at least partially covered by the protective layer 50, which at least partially covers the grid pattern 40 in the pixel region PIX.

The optical black pattern 47 may block light incident on the reference pixel 16. For example, the reference transistor may transfer and sense the amount of charge that may be generated from the reference photodiode to which light is blocked and take the sensed amount as a reference charge amount. The reference charge amount may be compared with a unit charge amount transferred from the reference pixel 16, and a signal sensed from each reference pixel 16 may be calculated according to the difference between the unit charge amount and the reference charge amount.

The via plug 48 and 49 may be disposed in the pad region PAD. The via plug 48 and 49 may be in contact with the interconnections 21 by passing through the interlayer insulating layer 20 and may be electrically connected to the wires 21.

Figure 3:
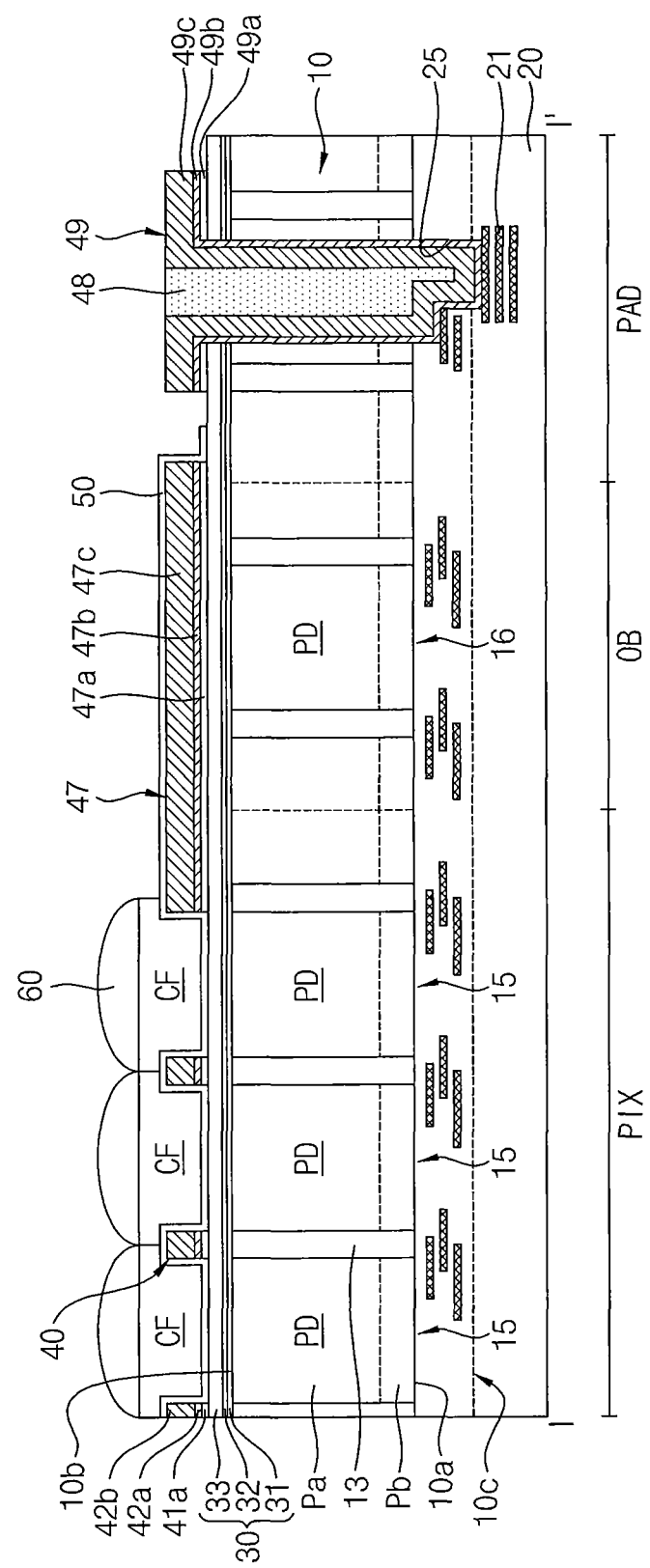
FIGS. 3 and 4 are vertical cross-sectional views taken along line I-I' according to some example embodiments of FIG. 1.
Figure 4:
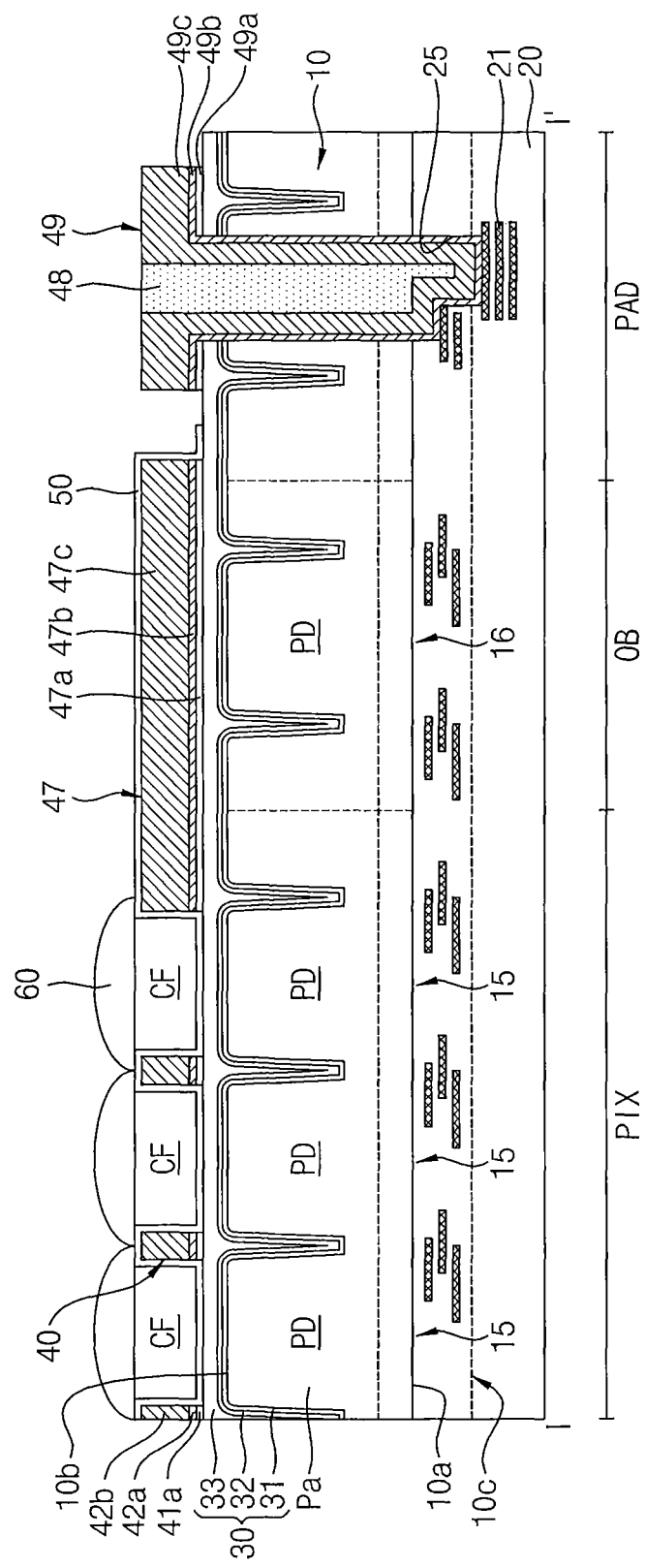
Figure 5:
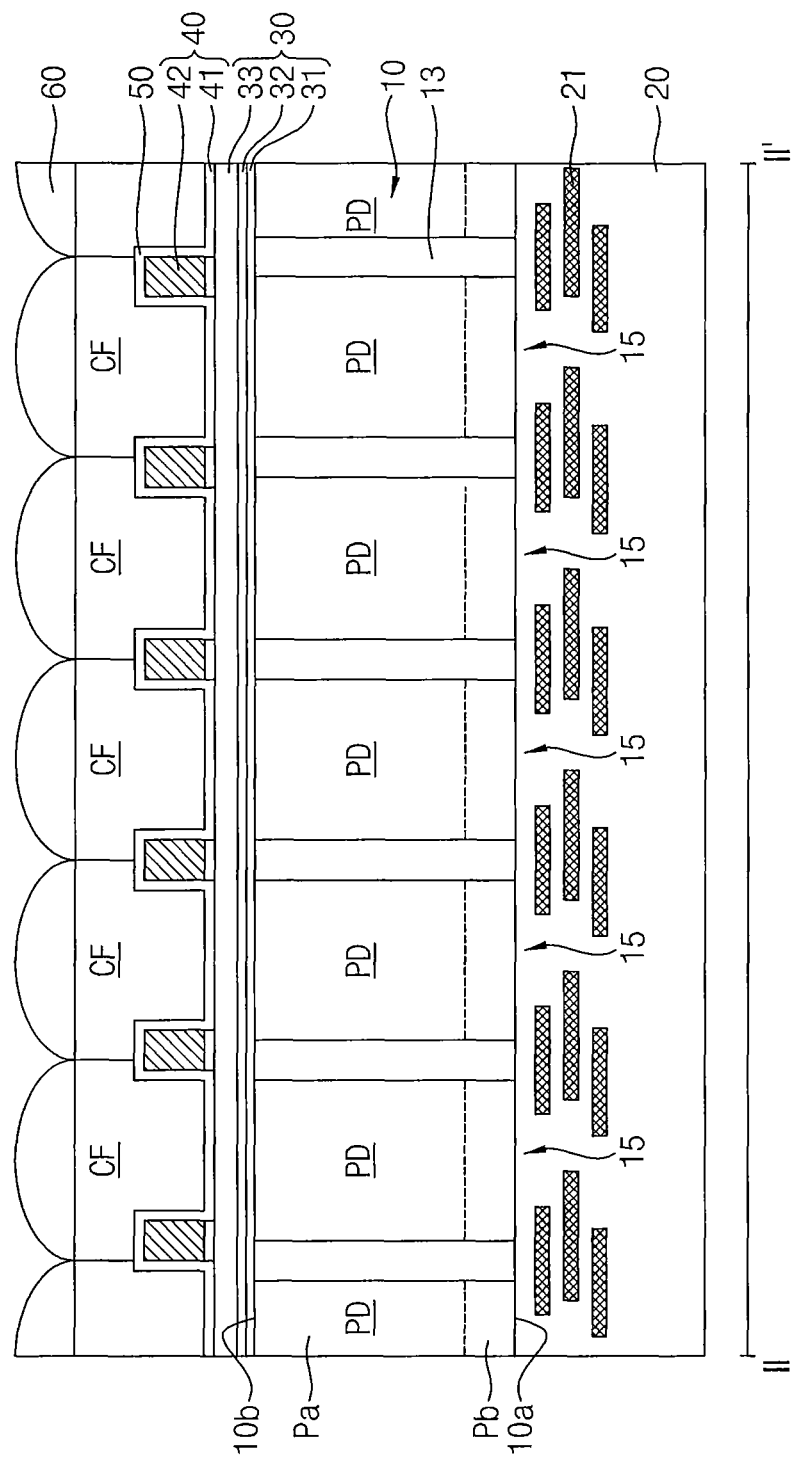
FIG. 5 is a vertical cross-sectional view taken along line II-IF according to some example embodiments of FIG. 1.

FIGS. 3 and 4 are vertical cross-sectional views taken along line I-I' according to some example embodiments of FIG. 1. FIG. 5 is a vertical cross-sectional view taken along line according to some example embodiments of FIG. 1. In FIGS. 1 to 5, the same reference numerals denote the same components, and a redundant description thereof will be omitted below for the sake of simplicity.

Referring to FIG. 3, the height of the protective layer 50 on the grid pattern 40 disposed in the pixel region PIX may be less than the height of the color filter CF. The height of the protective layer 50 on the optical black pattern 47 disposed in the optical black region OB may also be less than the height of the color filter CF.

Referring to FIG. 3, the element isolation layer 13 may pass through the second surface 10b of the substrate 10 and may be spaced apart from the first surface 10a. The element isolation layer 13 may be formed in a BDTI process. Referring to FIG. 5, the grid pattern 40 may be arranged, such that the center line of at least some of the plurality of grid patterns 40 is positioned to be misaligned with the center line of the element isolation layer 13 in a plan view thereof. Although not shown in the drawing, the center line of the grid pattern 40 may be a straight line perpendicularly passing through the center of the cross section of the grid pattern 40 shown in FIG. 5, and the center line of the element isolation layer 13 may be a straight line perpendicularly passing through the center of the element isolation layer 13. For example, as the grid pattern 40 is disposed closer to the center of the pixel region PIX in a plan view thereof, the center line thereof may be disposed closer to the center line of the element isolation layer 13. As the grid pattern 40 is disposed farther from the center of the pixel region PIX, the center line thereof may be disposed farther from the center line of the element isolation layer 13.

Figure 6:
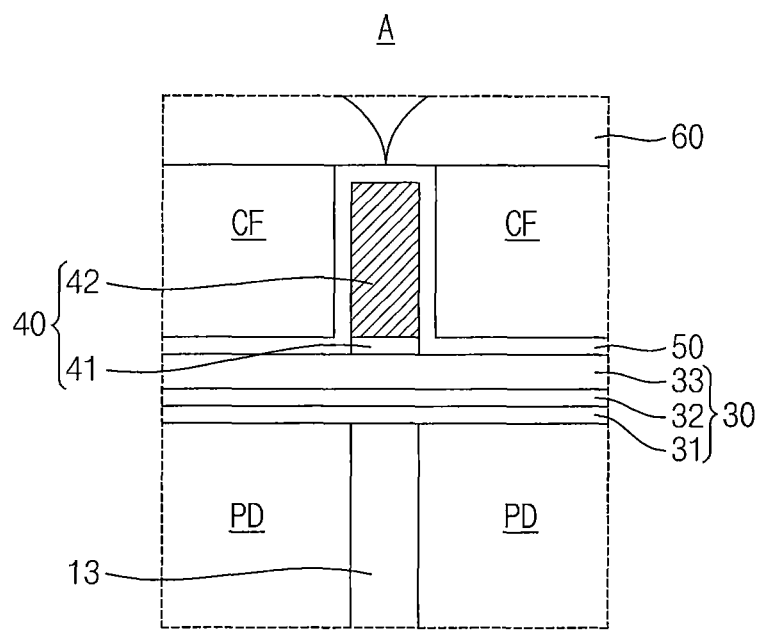
FIGS. 6 to 15 are enlarged views of region A according to some example embodiments of FIG. 2.
Figure 7:
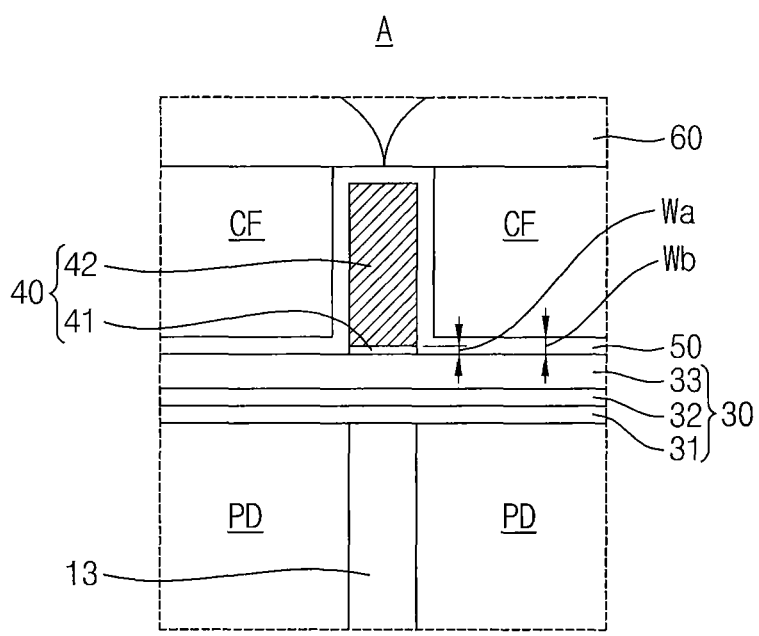

FIGS. 6 and 7 are enlarged cross-sectional views of region A according to some example embodiments of FIG. 2. In FIGS. 1 to 7, the same reference numerals denote the same components, and a redundant description thereof will be omitted below for the sake of simplicity.

Referring to FIGS. 2, 6, and 7, the grid pattern 40 may include a lower grid pattern 41 and an upper grid pattern 42. The lower grid pattern 41 may form the lower part of the grid pattern 40 and be disposed on the second insulating layer 33. The lower grid pattern 41 may be an etch stop pattern serving as an etch stop layer in an etching process. In one embodiment, the lower grid pattern 41 may include one or more materials, such as oxide, nitride, amorphous silicon (a-Si), and/or polysilicon (Poly-Si). For example, the lower grid pattern 41 may be lanthanum oxide (LaO). The upper grid pattern 42 may be disposed on the lower grid pattern 41.

The upper grid pattern 42 may be a laser shield pattern that reflects incident light obliquely incident on the substrate 10 to cause more incident light to reach the photodiode PD. The thickness of the upper grid pattern 42 may be greater than that of the lower grid pattern 41. In some embodiments, the upper grid pattern 42 may be a conductive material. For example, the upper grid pattern 42 may include tungsten (W).

In some embodiments, the thickness Wa of the lower grid pattern 41 may be less than or equal to the thickness Wb of the protective layer 50. For example, the thickness Wa of the lower grid pattern 41 may range from 1 nm to 100 nm, and in some embodiments from 1 nm to 20 nm. The sidewalls of the grid pattern 40 may be conformally formed as the thickness Wa of the lower grid pattern 41 decreases. When the thickness of the protective layer 50 is greater than the thickness Wa of the lower grid pattern 41, the surface of the protective layer 50 may be conformal even when the lower grid pattern 41 is over-etched in an etching process, and management of dispersion and surface roughness of the color filter CF on the protective layer 50 may be facilitated.

FIGS. 8 to 15 are enlarged cross-sectional views showing region A according to some example embodiments of FIG. 2. In FIGS. 1 to 15, the same reference numerals denote the same components, and a redundant description thereof will be omitted below for the sake of simplicity.

Figure 8:
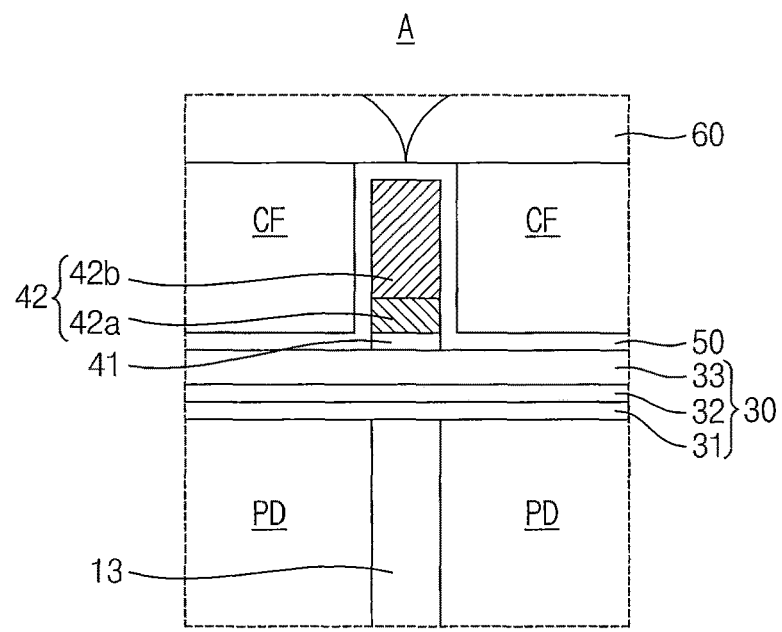

Referring to FIG. 8, the upper grid pattern 42 may be a multilayer structure. In some embodiments, the upper grid pattern 42 may include a first upper grid pattern 42a and a second upper grid pattern 42b. The first upper grid pattern 42a and the second upper grid pattern 42b may be sequentially laminated on the lower grid pattern 41. The first upper grid pattern 42a and the second upper grid pattern 42b may be metal layers including different conductive materials. For example, the first upper grid pattern 42a may include one or more materials, such as titanium (Ti) and/or titanium nitride (TiN). The second upper grid pattern 42b may include tungsten (W). In some embodiments, the thickness of the first upper grid pattern 42a may be less than the thickness of the second upper grid pattern 42b.

Figure 9:
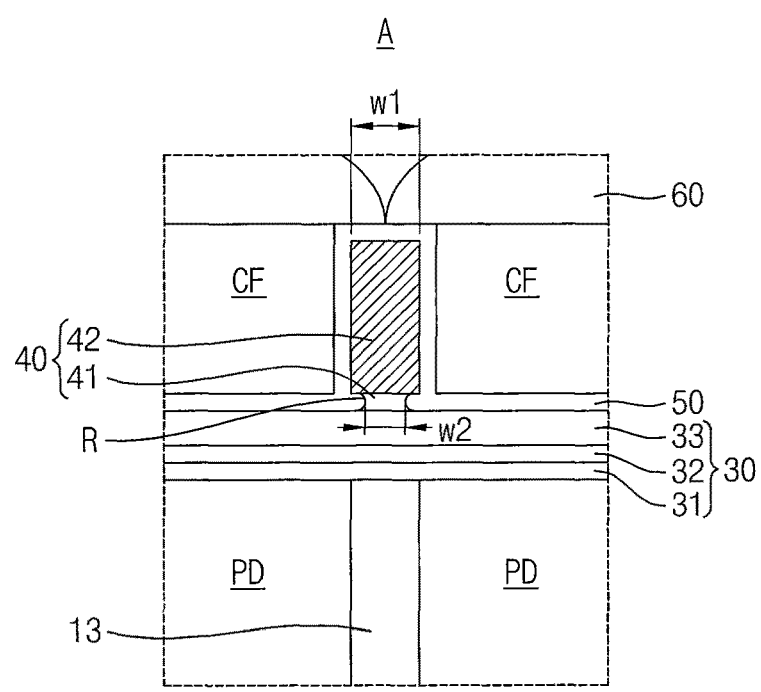
Figure 10:
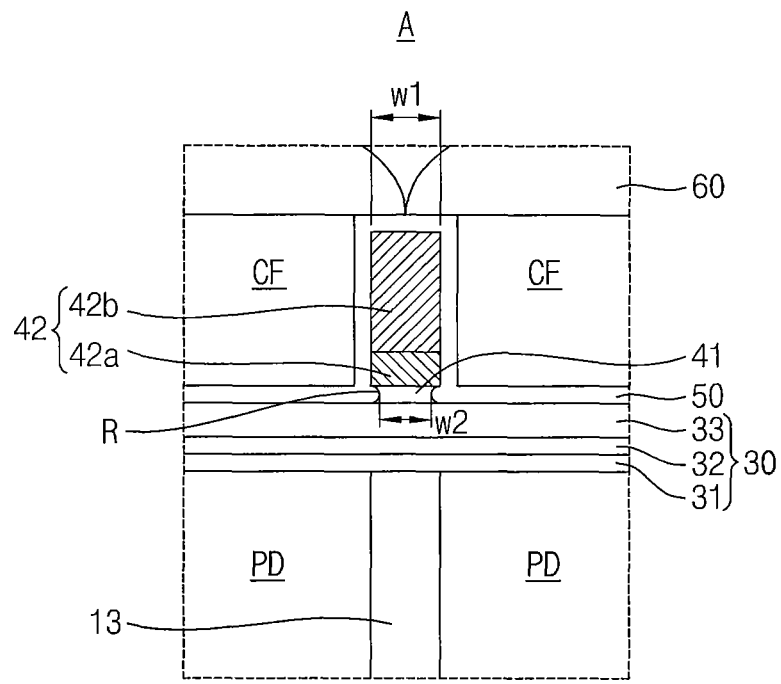

Referring to FIGS. 9 and 10, the lower portions of both sidewalls of the grid pattern 40 is recessed inward to form a recess R between the second insulating layer 33 and the upper grid pattern 42. The recess R may have a concave shape formed by recessing both sidewalls of the lower grid pattern 41 inward. The width w2 of the lower grid pattern 41 may be less than a width w1 of the upper grid pattern 42. That is, a shortest width w2 of the lower grid pattern 41 may be less than the shortest width w1 of the bottom surface of the upper grid pattern 42. As shown in FIG. 9, a part of the bottom surface of the upper grid pattern 42 may be exposed through the recess R and be in contact with the protective layer 50 without being in contact with the lower grid pattern 41. However, embodiments of the inventive concept are not limited thereto. When the recess R is formed as shown in FIG. 10, the bottom surface of the upper grid pattern 42 may be in contact with an entirety of the lower grid pattern 41 and may not be in contact with the protective layer 50.

Figure 11:
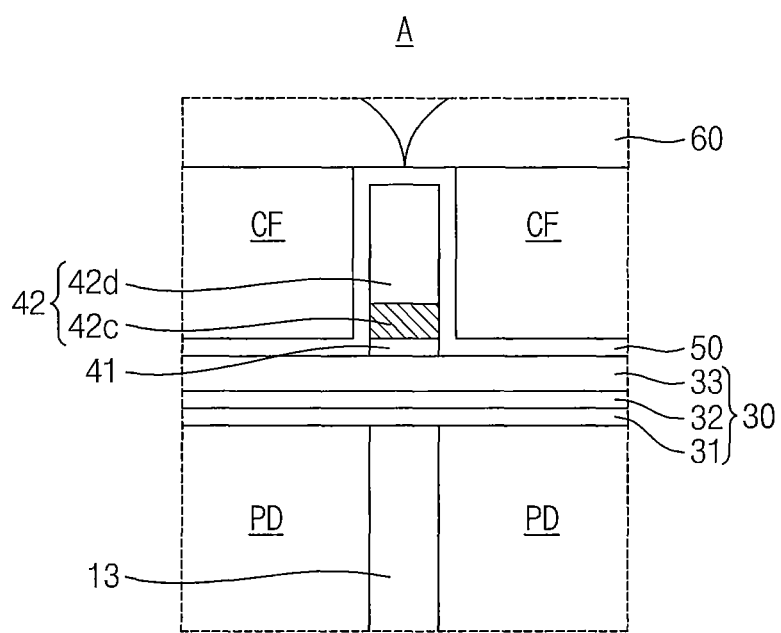

Referring to FIG. 11, the upper grid pattern 42 may include a first upper grid pattern 42c including a conductive material and a second upper grid pattern 42d including an insulating material. The first upper grid pattern 42c may be disposed on the lower grid pattern 41. The first upper grid pattern 42c may be a ground line. The photodiode PD collects electrons among the electron-hole pairs generated by incident light, and a metal line may serve as a drain of holes of the electron-hole pairs. For example, the first upper grid pattern 42c may include one or more materials, such as titanium (Ti) and/or titanium nitride (TiN).

The second upper grid pattern 42d may be disposed on the first upper grid pattern 42c. In some embodiments, the second upper grid pattern 42d may be formed of a material having a low refractive index (LRI). For example, the LRI material may be composed of silica nanoparticles of a porous structure or a reticular structure formed by deposition or coating of silicon oxide ($SiO_x$). The refractive index of the second upper grid pattern 42d may be lower than the refractive index of the microlens 60 or the color filter CF. For example, the refractive index of the second upper grid pattern 42d may range from 1.0 to 1.3. The second upper grid pattern 42d may reflect substantially all incident light to increase the amount of incident light that reaches the photodiode PD. That is, the second upper grid pattern 42d including the LRI material may be a laser shield pattern.

Figure 12:
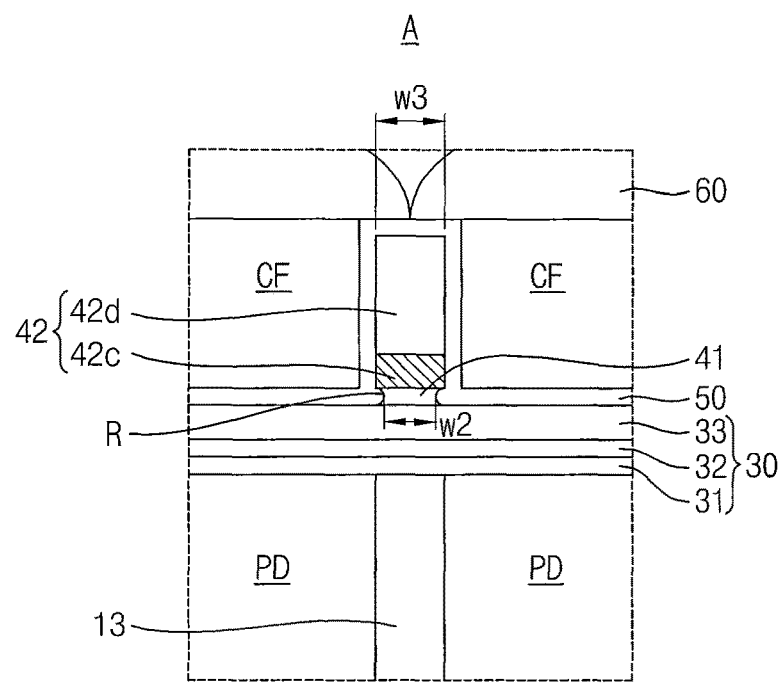

Referring to FIG. 12, a recess R may be formed under the grid pattern 42 even when the upper grid pattern 42 includes the LRI material. That is, the shortest width w2 of the lower grid pattern 41 may be substantially less than or equal to the shortest width w3 of the bottom surface of the first upper grid pattern 42c.

Figure 13:
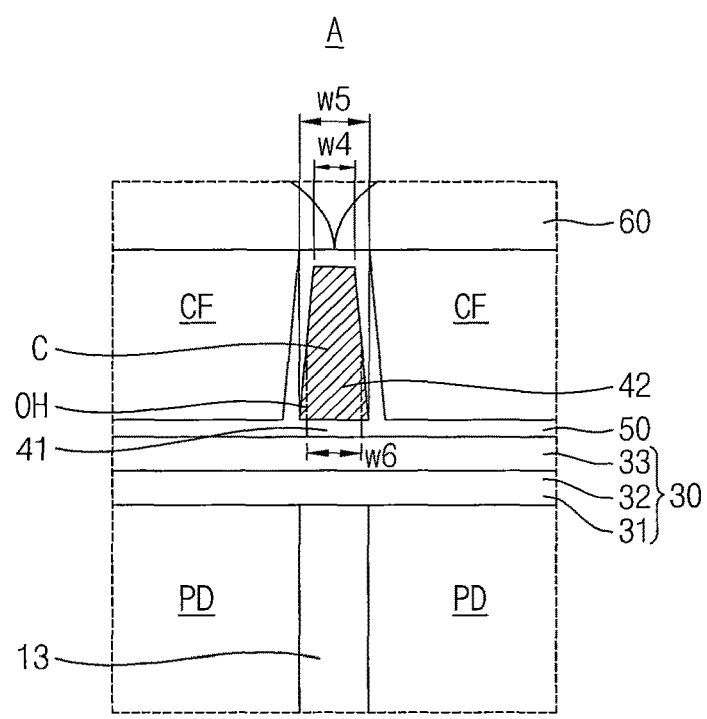
Figure 14:
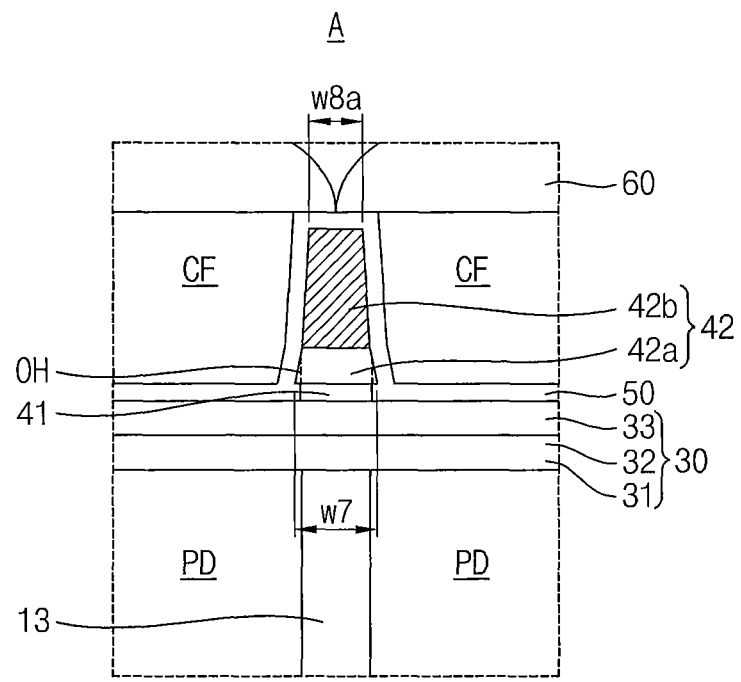
Figure 15:
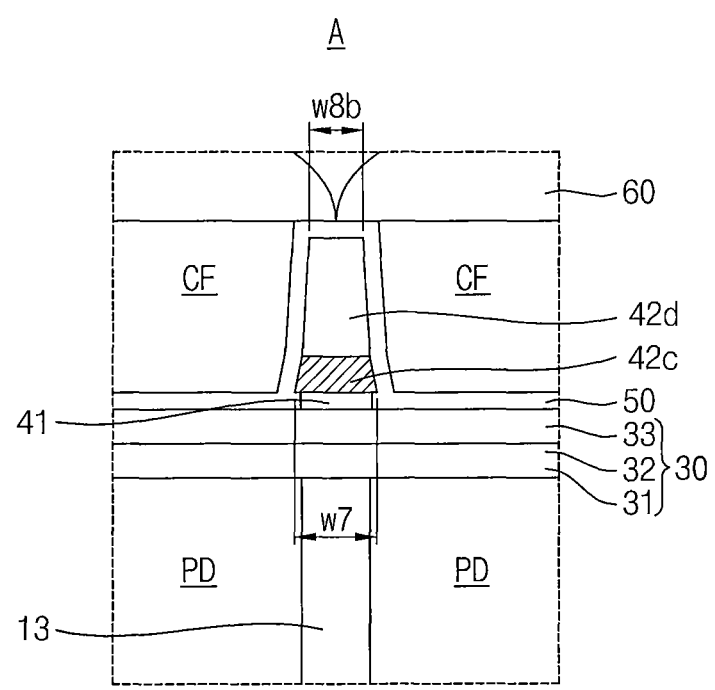

FIGS. 13 to 15 are enlarged cross-sectional views showing some example embodiments of region A of FIG. 2. In FIGS. 1 to 15, the same reference numerals denote the same components, and a redundant description thereof will be omitted below for the sake of simplicity.

Referring to FIG. 13, the upper grid pattern 42 may have a tapered shape whose width gradually decreases from the lower part to the upper part thereof. The width of the upper end w4 of the upper grid pattern 42 may be less than a width w5 of the lower end of the upper grid pattern 42. Both sidewalls of the upper grid pattern 42 may have a slope with respect to the second surface 10b of the substrate 10. The upper grid pattern 42 may include an overhang (OH) portion that does not overlap the lower grid pattern 41 in a plan view thereof. That is, the upper grid pattern 42 may include a central portion C overlapping the lower grid pattern 41 and an overhang OH protruding outward from both sides of the central portion C.

In some embodiments, a shortest width w6 of the lower grid pattern 41 may be substantially less than or equal to the shortest width w5 of the lower end of the upper grid pattern 42 and may be greater than a width w4 of the upper end of the upper grid pattern 42. In some embodiments, the width w6 of the lower grid pattern 41 may be less than the width w4 of the upper end of the upper grid pattern 42.

Referring to FIGS. 14 and 15, the upper grid pattern 42 may include first upper grid patterns 42a and 42c and second upper grid patterns 42b and 42d, which may include different materials. The first upper grid patterns 42a and 42c may include a conductive material and the second upper grid patterns 42b and 42d may include a conductive material or an insulating material having an LRI material. The widths of the first upper grid patterns 42a and 42c and the second upper grid patterns 42b and 42d may gradually increase from the upper end to the lower end thereof. In some embodiments, the slope of the sidewalls of the first upper grid patterns 42a and 42c with respect to the second surface 10b of the substrate 10 may be different from the slope of the sidewalls of the second upper grid patterns 42b and 42d with respect to the second surface 10b. The slope of the sidewalls of the first upper grid patterns 42a and 42c may be less than the slope of the sidewalls of the second upper grid patterns 42b and 42d. For example, the widths w8a and w8b of the second upper grid patterns 42b and 42d may be substantially uniform from the lower end to the upper end thereof. The width of the lower grid pattern 41 may be substantially less than or equal to the width w7 of the lower end of the first upper grid pattern 42a, 42c. The first upper grid patterns 42a and 42c may include an overhang (OH) portion that does not overlap the lower grid pattern 41 in a plan view thereof.

While the side surface of the lower grid pattern 41 is shown in FIGS. 13 to 15 as a straight line, embodiments of the inventive concept are not limited thereto. The side surface of the lower grid pattern 41 may have an inwardly recessed shape as shown in FIG. 9.

Figure 16:
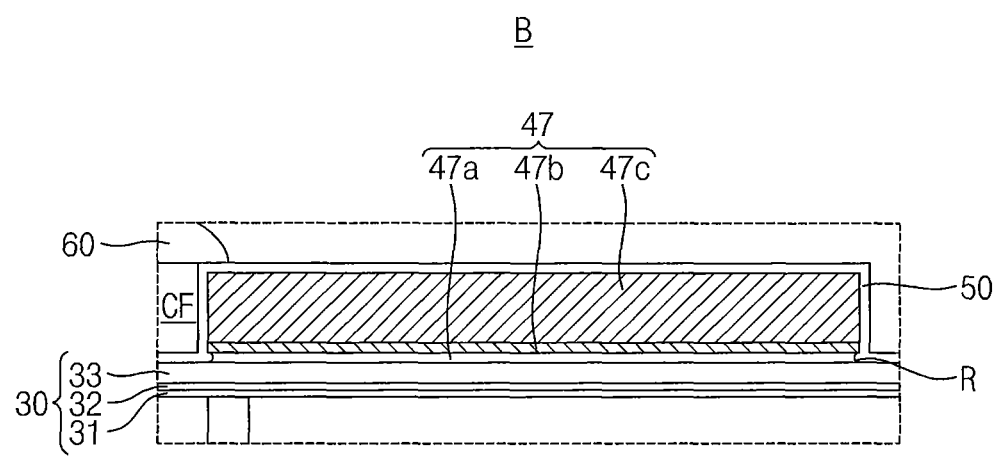
FIG. 16 is an enlarged view of region B according to some example embodiments of FIG. 2.
Figure 17:
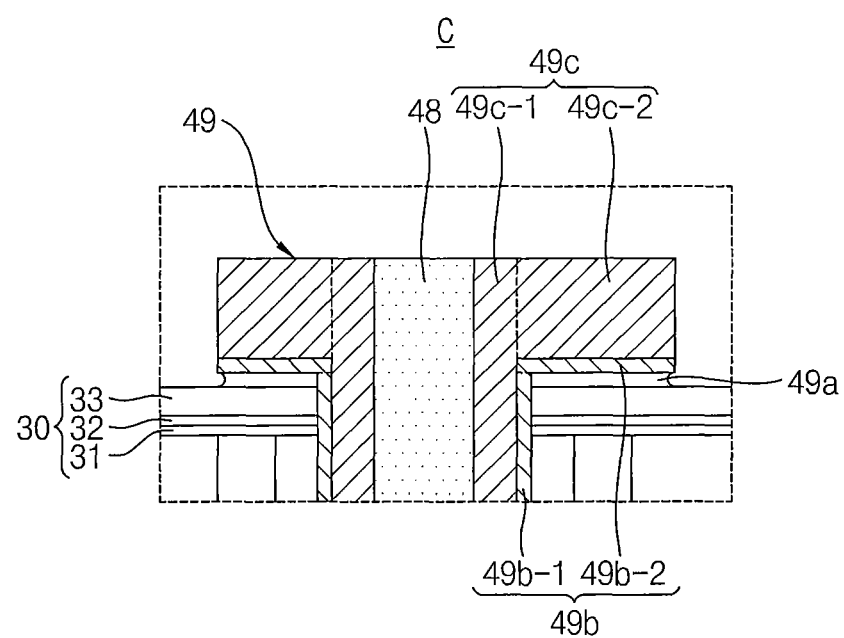
FIG. 17 is an enlarged view of region C according to some example embodiments of FIG. 2.

FIG. 16 is an enlarged cross-sectional view of region B according to some example embodiments of FIG. 2. FIG. 17 is an enlarged cross-sectional view of region C according to some example embodiments of FIG. 2. In FIGS. 1 to 17, the same reference numerals denote the same components, and a redundant description thereof will be omitted below for the sake of simplicity.

Referring to FIGS. 2 and 16, the optical black pattern 47 may include a first black pattern 47a, a second black pattern 47b, and a third black pattern 47c. The first to third black patterns 47a, 47b, and 47c may be formed of the same material as the lower grid pattern 41, the first upper grid patterns 42a and 42c and the second upper grid patterns 42b and 42d of the grid pattern 40, respectively. For example, the first black pattern 47a may include one or more materials, such as oxide, nitride, amorphous silicon (a-Si), polysilicon (Poly-Si), and/or lanthanum oxide (LaO). The second black pattern 47b may include titanium (Ti) and/or titanium nitride (TiN), and the third black pattern 47c may include tungsten (W).

The first black pattern 47a may have the same thickness as the lower grid pattern 41. For example, the thickness of the first black pattern 47a may be less than or equal to the thickness of the protective layer 50.

A recess R may be formed under the optical black pattern 47 on both sides thereof. The recess R may be formed by concavely recessing both sidewalls of the first black pattern 47a inward.

Referring to FIGS. 2 and 17, a via hole 25 and a via plug 48 and 49 may be disposed in the pad region PAD. The via hole 25 may pass through the substrate 10 and extend to the interlayer insulating layer 20 to expose the wires. The via plug 48 and 49 may be disposed in the via hole 25.

The via plug 48 and 49 may include a core pattern 48 and a pad pattern 49. The core pattern 48 may be surrounded by the pad pattern 49. The core pattern 48 may include a conductive material, an insulating material, or a combination thereof. In some embodiments, the core pattern 48 may include a carbon-based material.

The pad pattern 49 may be formed in contact with the sidewall of the via hole 25. The pad pattern 49 may include a lower pad pattern 49a and upper pad patterns 49b and 49c. The lower pad pattern 49a may be formed of the same material as the lower grid pattern 41 and the first black pattern 47a described above. The lower pad pattern 49a may be interposed between the upper pad patterns 49b and 49c and the stack structure 30.

The upper pad patterns 49b and 49c may include a first upper pad pattern 49b and a second upper pad pattern 49c. For example, the first upper pad pattern 49b may include the same material as the first upper grid pattern 42a and the second black pattern 47b, and the second upper pad pattern 49c may include the same material as the second upper grid pattern 42b and the third black pattern 47c.

The upper pad patterns 49b and 49c may include core portions 49b-1 and 49c-1 and pad portions 49b-2 and 49c-2. The core portions 49b-1 and 49c-1 may be disposed in the via hole 25, and the upper end thereof may extend to a position higher than the height of the stack structure 30. The pad portions 49b-2 and 49c-2 may be formed by extending an upper portion of the core portions 49b-1 and 49c-1 to the outside of the via hole 25. The pad portions 49b-2 and 49c-2 may be disposed on the lower pad pattern 49a.

The lower pad pattern 49a interposed between the upper pad patterns 49b and 49c and the stack structure 30 may be in contact with the core portions 49b-1 and 49c-1 of the upper pad patterns 49b and 49c on one side and may be exposed on the opposite side. The opposite side of the lower pad pattern 49a may be concavely recessed to form a structure such as the recess R of the grid pattern 40 described above.

FIGS. 18 to 24 are process cross-sectional views illustrating a method of manufacturing an image sensor having a cross section taken along line II-IF of FIG. 1. In FIGS. 1 to 24, the same reference numerals denote the same components, and a redundant description thereof will be omitted below for the sake of simplicity.

Figure 18:
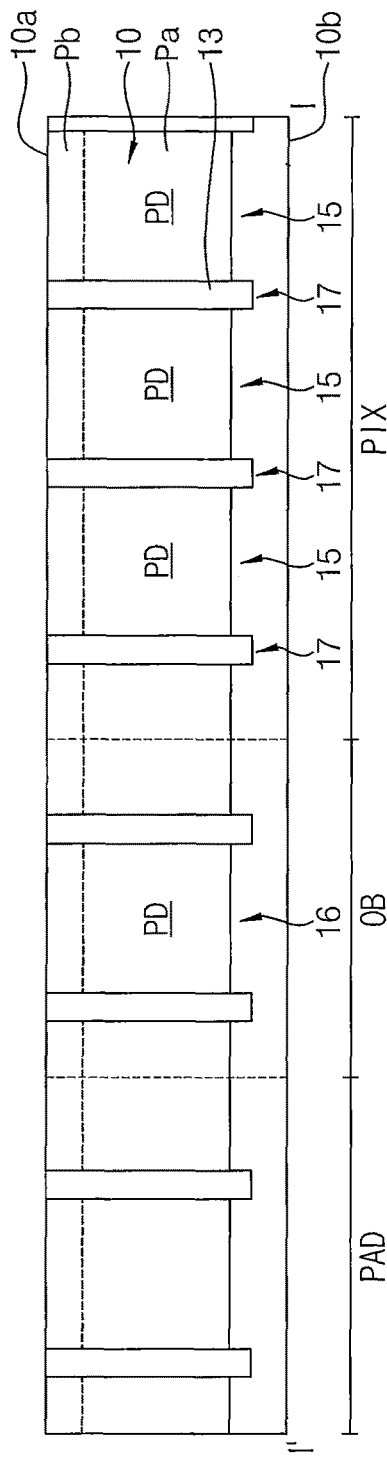
Figure 19:
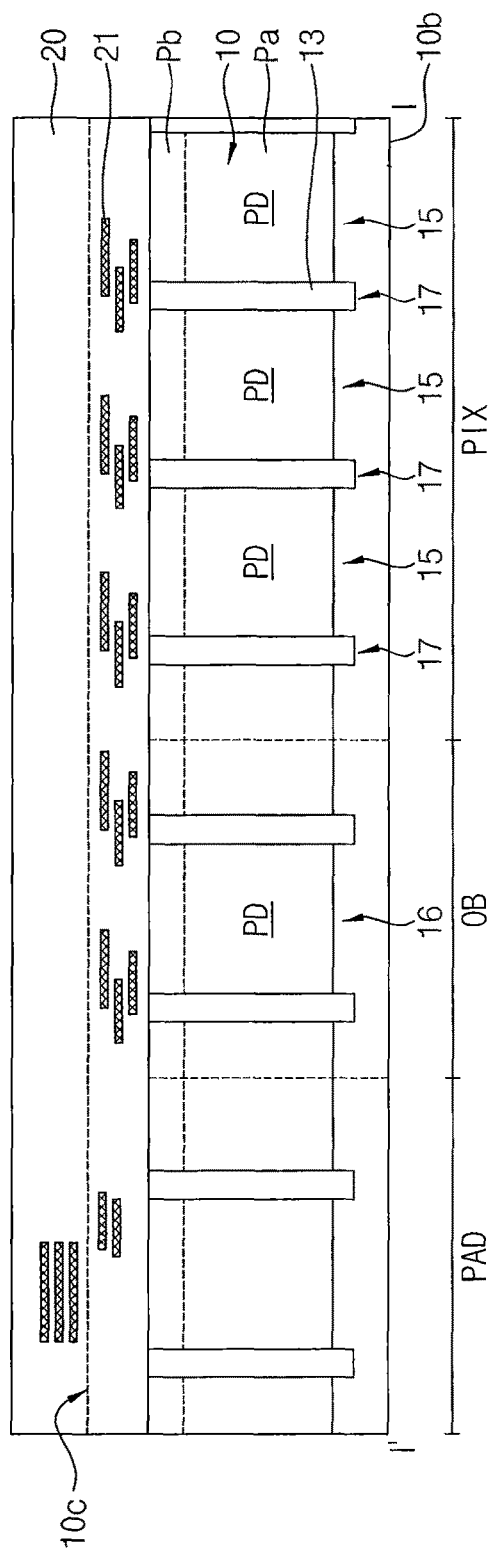

Referring to FIGS. 18 and 19, an element isolation layer 13 and a photodiode PD may be formed in a substrate 10, which may include a first surface 10a and a second surface 10b facing in opposite directions. The first surface 10a of the substrate 10 may be a front surface, and the second surface 10b of the substrate 10 may be a rear surface before grinding. A mask pattern may be formed on the first surface 10a of the substrate 10 and a trench may be formed from the first surface 10a toward the second surface 10b in an etching process using the mask pattern. The isolation layer 13 may be formed by at least partially filling the trench with an insulating material. The element isolation layer 13 may divide the substrate 10 into a plurality of pixel regions PIX.

A photodiode PD may be formed in each of a plurality of unit pixels 15 through an impurity doping process. The photodiode PD may be formed adjacent to the first surface 10a of the substrate 10. The photodiode PD may include a first impurity region Pa and a second impurity region Pb, which are of different conductivity types. For example, the first impurity region may be formed deep inside the substrate 10 so as to be spaced apart from the first surface 10a of the substrate 10. The second impurity region may be thin and formed adjacent to the first surface 10a.

Interconnection structures 20 and 21 may be formed on the first surface 10a of the substrate 10. The interconnection structures 20 and 21 may include an interlayer insulating layer 20 and wires 21. While the interlayer insulating layer 20 is shown as a single monolithic layer, the interlayer insulating layer 20 may, in other embodiments, be a multi-layer. For example, the interlayer insulating layer 20 may include an insulating material, such as silicon oxide. The wires 21 may include a conductive material, such as a metal, a metal oxide, a metal nitride, a metal silicide, polysilicon, conductive carbon, or a combination thereof. For example, the wires 21 may include one or more materials, such as copper (Cu), titanium (Ti), tungsten (W), and/or titanium nitride. Although not shown in the drawings, a support substrate may be bonded onto the interconnection structures 20 and 21. The support substrate may serve to support the substrate 10 and the interconnection structures 20 and 21 in performing subsequent processes.

Referring to FIG. 20, the substrate 10 may be inverted, such that the interconnection structures 20 and 21 are disposed on the lower side of the substrate 10. The second surface 10b of the substrate 10 may be ground and, thus, a portion of the substrate 10 may be removed. In some embodiments, the element isolation layer 13 may be exposed by the grinding process.

Referring to FIG. 21, a first insulating layer 31, an anti-reflective layer 32, a second insulating layer 33, and an etch stop layer 34 may be sequentially laminated on the substrate 10. In some embodiments, the second surface 10b of the substrate 10 may be processed with oxygen plasma before formation of the first insulating layer 31 to lower the density of surface defects and reduce or prevent dispersion of the metal element (e.g., Al) of the first insulating layer 31.

A via hole 25 may be formed in the pad region PAD by sequentially etching parts of the etch stop layer 34, the second insulating layer 33, the anti-reflective layer 32, and the first insulating layer 31. The via hole 25 may be formed through a patterning process, such as an anisotropic etching process. The via hole 25 may expose the wires disposed in the pad region PAD. In the process of forming the via hole 25, the interconnection structures 20 and 21 may also be partially etched. The via hole 25 may be disposed to be spaced apart from the element isolation layer 13 disposed in the pad region PAD. The shape of the via hole 25 is not limited to the shape shown in FIG. 21 and may have various shapes in accordance with different embodiments of the inventive concept.

Metal layers 35 and 36 at least partially covering the surfaces of the etch stop layer 34 and the via hole 25 may be formed. The metal layers 35 and 36 may be in direct contact with the wires. The metal layers 35 and 36 may be in contact with the wires in a support substrate bonded before grinding. The metal layers 35 and 36 may not completely fill the inside of the via hole 25, but may be formed such that a remaining space 26 is left in the via hole 25.

In some embodiments, the metal layers 35 and 36 include a first metal layer 35 formed in contact with the surfaces of the etch stop layer 34 and the via hole 25 and a second metal layer 36 formed in contact with the surface of the first metal layer 35. The metal layers 35 and 36 may include a conductive material, such as a metal, a metal oxide, a metal nitride, a metal silicide, polysilicon, conductive carbon, or a combination thereof. For example, the first metal layer 35 may include one or more materials, such as titanium (Ti), titanium nitride (TiN), tantalum (Ta), and tantalum nitride (TaN). Parts of the first metal layer 35 and the second metal layer 36 formed in the pixel region PIX may partition the unit pixels 15 through a subsequent process and may be provided for a laser shield pattern for condensing incident light into the photodiode PD. Parts of the first metal layer 35 and the second metal layer 36 formed in the optical black region OB may be provided for a light shield layer for blocking light incident on the optical black region OB. In addition, the second metal layer 36 may be provided for a via plug 49 to be connected with a pad (not shown) through a subsequent process. For example, in some embodiments, the second metal layer 36 may include tungsten (W).

In some embodiments, a metal layer 35 may at least partially cover the surfaces of the etch stop layer 34 and the via hole 25, and an LRI layer may at least partially cover the metal layer 35. The metal layer 35 may include one or more materials, such as titanium (Ti) and/or titanium nitride (TiN), and the LRI layer may include porous silica nanoparticles.

Figure 22:
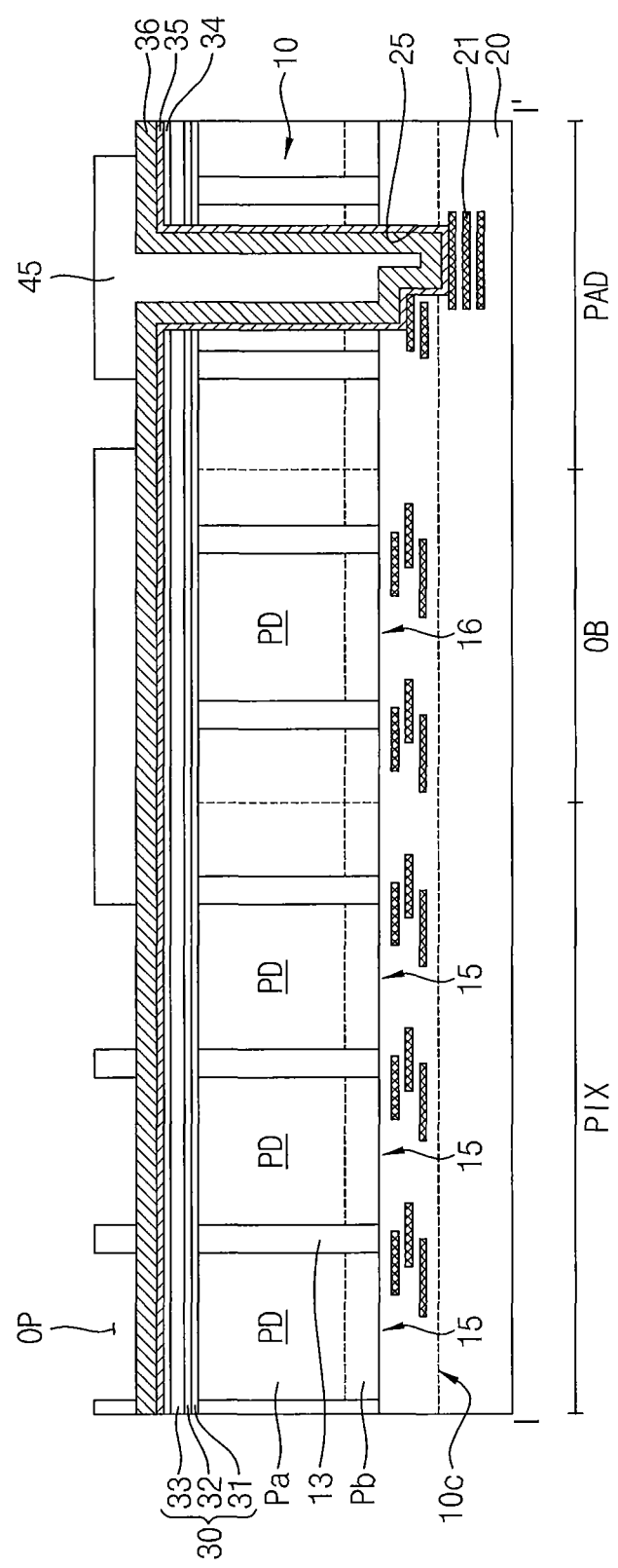

Referring to FIG. 22, a hard mask pattern 45 may be formed on the metal layers 35 and 36. The hard mask pattern 45 may be disposed in a light blocking region 17 in the pixel region PIX. In addition, the hard mask pattern 45 may at least partially cover the optical black region OB and at least partially fill the remaining space 26 of the via hole 25 in the pad region PAD. The open area OP between the hard mask patterns 45 may expose the upper surface of the metal layers 35 and 36.

Figure 23:
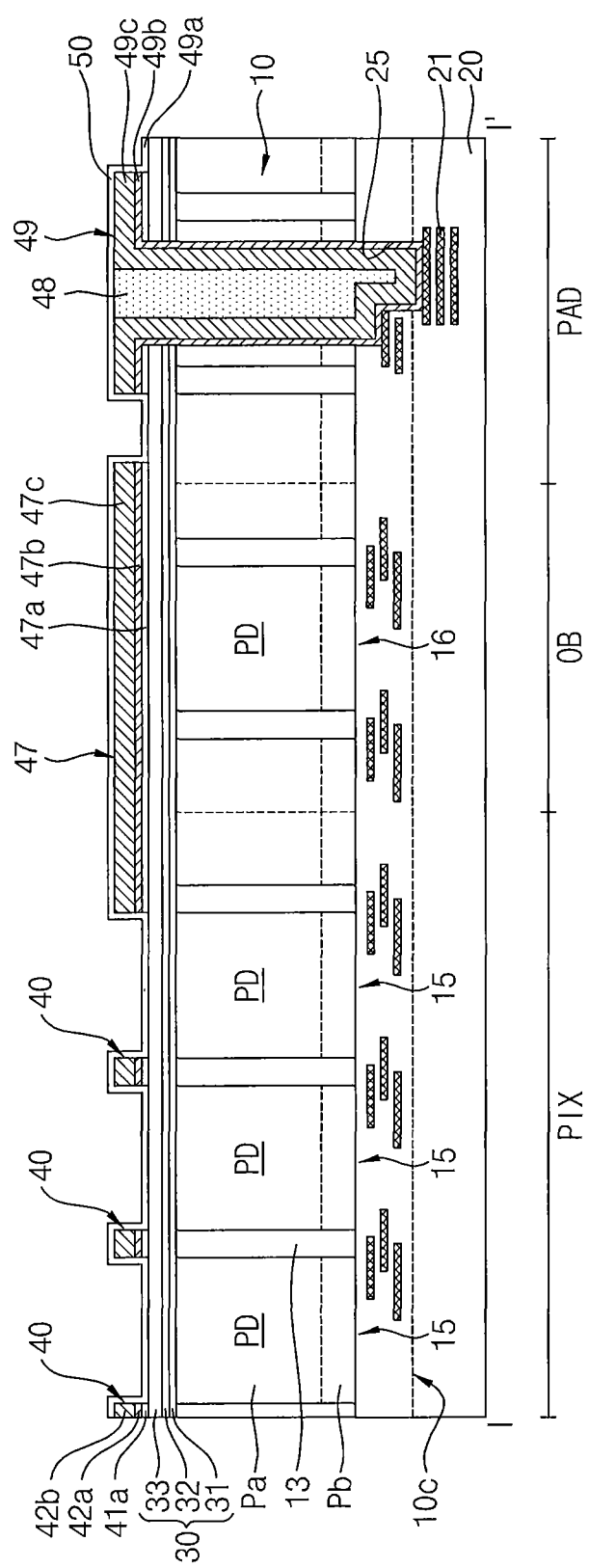
Figure 24:
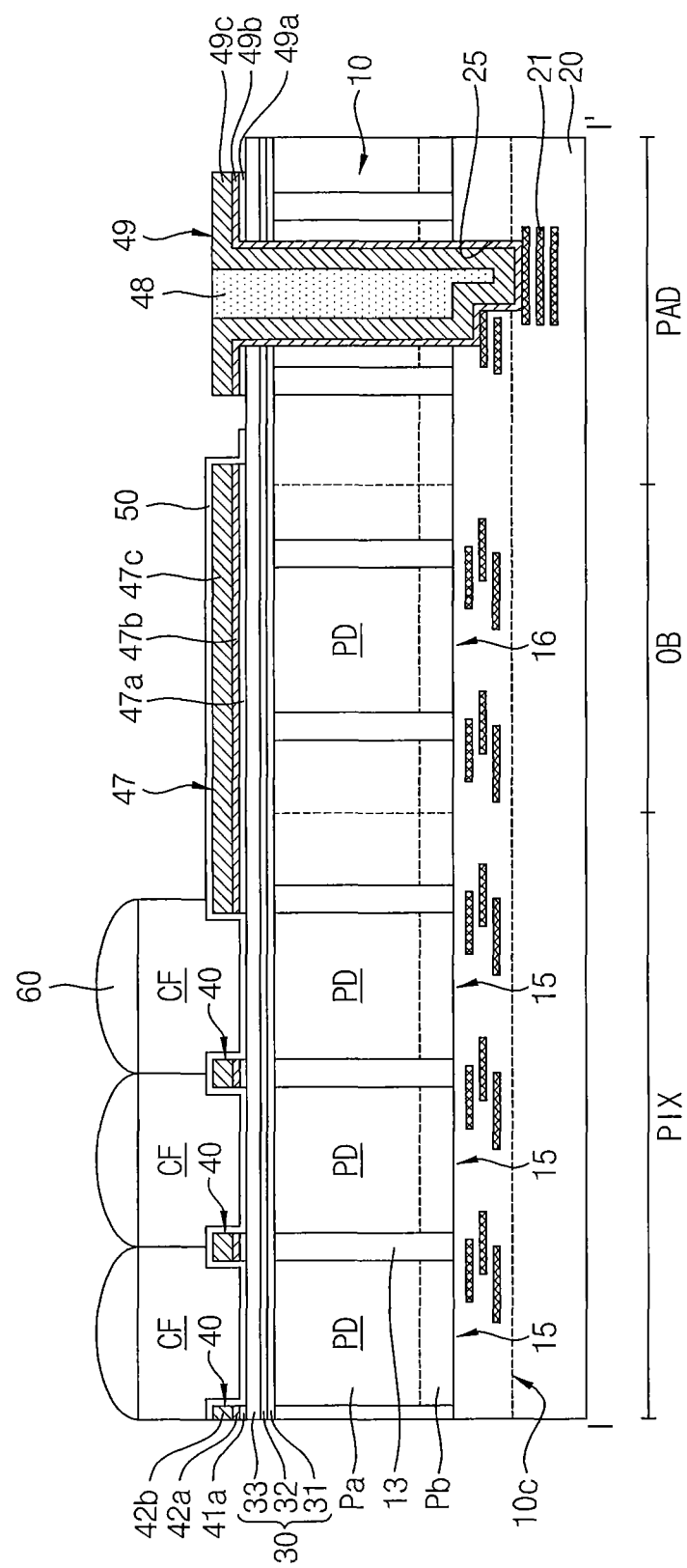

Referring to FIG. 23, after the metal layers 35 and 36 are etched down to the top of the etch stop layer 34 through a dry etching process using the hard mask pattern 45, the etch stop layer 34 may be etched through a wet etching process.

Thereby, the grid pattern 40 may be formed in the pixel region PIX, the optical black pattern 47 may be formed in the optical black region OB, and the pad pattern 49 may be formed in the pad region PAD.

The etch stop layer 34 may comprise a material with an etching selectivity with respect to the metal layers 35 and 36 and remain in an unetched state while the metal layers 35 and 36 are dry-etched. The etch stop layer 34 may be removed, for example, by a wet etching process using, for example, an HCl solution, a diluted sulfuric acid peroxide (DSP) solution, and/or a NH$_4$OH solution. The etch stop layer 34 may comprise a material with a wet etching selectivity with respect to the insulating layer including SiO$_2$. The insulating layer may remain on the resultant structure without being recessed while the etch stop layer 34 is removed.

The via plug 48 and 49 may be formed by forming the core pattern 48 in the pad pattern 49. The core pattern 48 may, in some embodiments, be formed to completely fill the inside of the pad pattern 49. That is, the core pattern 48 may fill the remaining space 26 formed after the metal layers 35 and 36 are formed in the via hole 25. The pad pattern 49 may at least partially surround the side surfaces and the bottom of the core pattern 48. The core pattern 48 may include a conductive material, an insulating material, or a combination thereof. In some embodiments, the core pattern 48 may include a carbon-based material.

A protective layer 50 may be formed to at least partially cover the grid pattern 40, the optical black pattern 47, and the via plug 48 and 49. The protective layer 50 may also at least partially cover the top surface of the second insulating layer 33 exposed by the open area OP Referring to FIG. 24, at least a part of the protective layer 50 in the pad region PAD may be removed. A part of the protective layer 50 that covers the via plug 48 and 49 may be removed to expose an upper portion of the via plug 48 and 49.

Color filters CF may be formed on the protective layer 50 in the pixel region PIX. The color filters CF may be formed to correspond to each of the unit pixels 15. The level of the upper ends or upper surfaces of the color filters CF may correspond to or be higher than the level of the upper end or upper surfaces of the grid pattern 40. Microlenses 60 may be formed on the color filters CF in the pixel region PIX.

According to some example embodiments of the inventive concept, an etch stop layer may be provided between a laser shield pattern and a substrate, and the etch stop layer can be selectively removed from a unit pixel. As the etch stop layer is selectively removed, a light transmitting layer under a color filter may not be recessed. The signal to noise ratio (SNR) of an image sensor can be enhanced, and dispersion degradation of the light transmitting layer and the color filter can be managed in the process of manufacturing an image sensor. As a result, the sensitivity of the image sensor can be improved.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. An image sensor comprising:
   a substrate comprising a plurality of unit pixels;
   a photodiode and an element isolation layer in the substrate;
   an interconnection structure on a first surface of the substrate;
   a stack structure on a second surface of the substrate; and
   a grid pattern between ones of the plurality of unit pixels on the stack structure,
   wherein the grid pattern comprises a lower grid pattern and an upper grid pattern physically contacting the lower grid pattern, the lower grid pattern comprising lanthanum oxide (LaO), amorphous silicon (a-Si), or polysilicon (poly-Si) and the upper grid pattern comprising a conductive material.

2. The image sensor of claim 1, wherein the lower grid pattern has a thickness of about 1 nm to about 20 nm.

3. The image sensor of claim 1, wherein the upper grid pattern comprises a first upper grid pattern and a second upper grid pattern, each of the first and second upper grid patterns comprising a different material.

4. The image sensor of claim 3, wherein the first upper grid pattern comprises a conductive material and the second upper grid pattern comprises a low refractive index (LRI) material.

5. The image sensor of claim 4, wherein a refractive index of the LRI material of the second upper grid pattern is in a range of about 1.0 to about 1.3.

6. The image sensor of claim 1, wherein the grid pattern further comprises a concave recess in a lower portion of a sidewall of the grid pattern.

7. The image sensor of claim 6, wherein a shortest width between both sidewalls of the lower grid pattern is less than a shortest width between both sidewalls of the upper grid pattern.

8. The image sensor of claim 6, wherein a bottom surface of the upper grid pattern is partially exposed through the recess.

9. The image sensor of claim 1, wherein the stack structure comprises:
   a first insulating layer in contact with the substrate, the first insulating layer comprising aluminum oxide (Al$_2$O$_3$);
   an anti-reflective layer on the first insulating layer; and
   a second insulating layer on the anti-reflective layer and comprising silicon oxide (SiO$_2$).

10. The image sensor of claim 9, further comprising a protective layer on the second insulating layer and the grid pattern.

11. The image sensor of claim 10, wherein the protective layer comprises aluminum oxide (AlO).

12. The image sensor of claim 10, wherein a thickness of the protective layer is greater than or equal to a thickness of the lower grid pattern.

13. The image sensor of claim 10, wherein the upper grid pattern comprises a central portion overlapping the lower grid pattern and an overhang extending from both sides of the central portion in a plan view thereof.

14. The image sensor of claim 13, wherein the protective layer is in contact with a bottom surface of the overhang.

15. The image sensor of claim 13, wherein the lower grid pattern is wet-etched by at least one of an HCl solution, a diluted sulfuric acid peroxide (DSP) solution, or a NH$_4$OH solution.

16. An image sensor comprising:
   a substrate comprising a photodiode in a pixel region and an optical black region adjacent the pixel region; and
   an optical black pattern in the optical black region, the optical black pattern not vertically overlapping a photodiode in the pixel region in a cross-sectional view of the image sensor, the optical black pattern comprising first, second, and third black patterns that are sequentially stacked and comprise different materials, wherein lower ends of sidewalls of the optical black pattern have concave recesses, respectively.

17. The image sensor of claim 16, wherein the first black pattern comprises at least one of lanthanum oxide (LaO), amorphous silicon (a-Si), or polysilicon (poly-Si).

18. The image sensor of claim 16, further comprising:
a pad region outside of the optical black region;
a via plug in the pad region and extending through the substrate; and
a stack structure over the pixel region, the optical black region, and the pad region.

19. The image sensor of claim 18, wherein the via plug comprises:
an upper pad pattern comprising a core portion passing through the substrate and a pad portion horizontally extending an upper portion of the core portion, the upper portion of the core portion being at a higher position than the stack structure, such that the stack structure is between the upper portion of the core portion and the substrate; and
a lower pad pattern between the upper pad pattern and the stack structure.

20. The image sensor of claim 18, wherein a concave recess is formed in lower ends of both sidewalls of the via plug on the stack structure.

* * * * *